(12) United States Patent
Zhang et al.

(10) Patent No.: US 9,374,045 B2
(45) Date of Patent: *Jun. 21, 2016

(54) SIGNAL PATH TERMINATION

(71) Applicant: Skyworks Solutions, Inc., Woburn, MA (US)

(72) Inventors: Guohao Zhang, Nanjing (CN); Hardik Bhupendra Modi, Irvine, CA (US); Dinhphuoc Vu Hoang, Anaheim, CA (US)

(73) Assignee: Skyworks Solutions, Inc., Woburn, MA (US)

(*) Notice: Subject to any disclaimer, the term of this patent is extended or adjusted under 35 U.S.C. 154(b) by 0 days.

This patent is subject to a terminal disclaimer.

(21) Appl. No.: 14/622,482

(22) Filed: Feb. 13, 2015

(65) Prior Publication Data

US 2015/0171799 A1 Jun. 18, 2015

Related U.S. Application Data

(63) Continuation of application No. 13/543,472, filed on Jul. 6, 2012, now Pat. No. 8,983,406.

(60) Provisional application No. 61/505,956, filed on Jul. 8, 2011.

(51) Int. Cl.
*H04B 1/04* (2006.01)
*H03F 1/56* (2006.01)
(Continued)

(52) U.S. Cl.
CPC .............. *H03F 1/56* (2013.01); *H03F 1/3205* (2013.01); *H03F 1/565* (2013.01); *H03F 3/19* (2013.01);
(Continued)

(58) Field of Classification Search
CPC ..... H03F 1/565; H03F 2200/318; H03F 3/601; H03F 3/245
USPC ............. 455/127.2, 127.3, 194.2, 114.1, 341; 330/302, 307
See application file for complete search history.

(56) References Cited

U.S. PATENT DOCUMENTS 5,300,895 A 4/1994 Jones
5,347,229 A 9/1994 Suckling et al.
(Continued)

FOREIGN PATENT DOCUMENTS

CN 1702959 A 11/2005
CN 1914791 A 2/2007
(Continued)

OTHER PUBLICATIONS

Ali et al, "Efficiency Enhancement of a Tunable RF Power Amplifier by Second Harmonic Manipulation using Thin-Film BST Varactor," Proceedings of Asia-Pacific Microwave Conference, 2010, pp. 434-436.

(Continued)

*Primary Examiner* — Sonny Trinh
(74) *Attorney, Agent, or Firm* — Knobbe, Martens, Olson & Bear, LLP

(57) ABSTRACT

This disclosure relates to a harmonic termination circuit that is separate from a load line. In one embodiment, the load line is configured to match an impedance at the power amplifier output at a fundamental frequency of the power amplifier output and the harmonic termination circuit is configured to terminate at a phase corresponding to a harmonic frequency of the power amplifier output. According to certain embodiments, the load line and the harmonic termination circuit can be electrically coupled to the power amplifier output external to a power amplifier die via different output pins of the power amplifier die.

20 Claims, 10 Drawing Sheets

(51) Int. Cl.
*H03F 1/32* (2006.01)
*H03F 3/24* (2006.01)
*H03F 3/60* (2006.01)
*H03F 3/19* (2006.01)
*H03F 3/21* (2006.01)

(52) U.S. Cl.
CPC .............. *H03F 3/21* (2013.01); *H03F 3/245* (2013.01); *H03F 3/601* (2013.01); *H01L 2223/6611* (2013.01); *H01L 2223/6655* (2013.01); *H01L 2224/48227* (2013.01); *H01L 2924/10329* (2013.01); *H01L 2924/13051* (2013.01); *H01L 2924/1421* (2013.01); *H01L 2924/19042* (2013.01); *H01L 2924/19105* (2013.01); *H03F 2200/165* (2013.01); *H03F 2200/171* (2013.01); *H03F 2200/318* (2013.01); *H03F 2200/411* (2013.01); *H03F 2200/451* (2013.01); *Y10T 29/4913* (2015.01)

(56) References Cited

U.S. PATENT DOCUMENTS

| | | | |
|---|---|---|---|
| 5,748,042 | A | 5/1998 | Norris et al. |
| 6,140,892 | A | 10/2000 | Uda et al. |
| 6,384,688 | B1 | 5/2002 | Fujioka et al. |
| 6,577,199 | B2 | 6/2003 | Dent |
| 6,750,546 | B1 | 6/2004 | Villanueva et al. |
| 7,202,736 | B1 | 4/2007 | Dow et al. |
| 7,265,618 | B1 | 9/2007 | Meck |
| 7,372,334 | B2 | 5/2008 | Blair et al. |
| 7,643,800 | B2 | 1/2010 | Rofougaran |
| 7,728,696 | B2 | 6/2010 | Stuebing et al. |
| 7,733,118 | B2 | 6/2010 | Hollis et al. |
| 7,733,187 | B2 | 6/2010 | Tateoka et al. |
| 7,852,281 | B2 * | 12/2010 | Choudhury .......... H01Q 1/2291 343/700 MS |
| 7,872,523 | B2 | 1/2011 | Sivakumar et al. |
| 8,081,928 | B2 | 12/2011 | Kelly |
| 8,164,387 | B1 | 4/2012 | Apel et al. |
| 8,274,162 | B2 * | 9/2012 | Monthei ............. H01L 23/5386 257/781 |
| 8,301,106 | B2 | 10/2012 | Misra |
| 8,611,834 | B2 | 12/2013 | Harris et al. |
| 8,797,103 | B2 | 8/2014 | Kaczman et al. |
| 8,983,406 | B2 | 3/2015 | Zhang et al. |
| 9,041,472 | B2 | 5/2015 | Chen et al. |
| 9,083,282 | B2 | 7/2015 | Zhang et al. |
| 9,231,533 | B2 | 1/2016 | Zhang et al. |
| 2005/0104679 | A1 | 5/2005 | Blednov |
| 2005/0122164 | A1 | 6/2005 | Brandt et al. |
| 2006/0181351 | A1 | 8/2006 | Ripley |
| 2007/0024374 | A1 | 2/2007 | Blair et al. |
| 2007/0057731 | A1 | 3/2007 | Le |
| 2008/0039025 | A1 | 2/2008 | Ray et al. |
| 2010/0060357 | A1 | 3/2010 | Drogi et al. |
| 2010/0253435 | A1 | 10/2010 | Ichitsubo et al. |
| 2011/0195677 | A1 | 8/2011 | Misra |
| 2013/0029619 | A1 | 1/2013 | Zhang et al. |
| 2013/0084816 | A1 | 4/2013 | Gomez et al. |
| 2013/0116017 | A1 | 5/2013 | Zhang et al. |
| 2013/0130752 | A1 | 5/2013 | Zhang et al. |
| 2015/0009980 | A1 | 1/2015 | Modi et al. |
| 2015/0295548 | A1 | 10/2015 | Zhang et al. |

FOREIGN PATENT DOCUMENTS

| | | |
|---|---|---|
| CN | 101505178 A | 8/2009 |
| CN | 101981810 A | 2/2011 |
| CN | 102217138 A | 10/2011 |
| CN | 103988424 A | 8/2014 |
| CN | 104011998 A | 8/2014 |
| GB | 2510084 | 7/2014 |
| WO | WO 2010-134858 | 11/2010 |
| WO | WO 2013/009640 | 1/2013 |
| WO | WO 2013/067031 | 5/2013 |
| WO | WO 2013/071152 | 5/2013 |

OTHER PUBLICATIONS

Bischof et al, "SiGe-Power Amplifiers in Flipchip and Packaged Technology," IEEE Radio Frequency Circuits Symposium, 2001, pp. 35-38.

Tombak et al, "A Flip-Chip Silicon IPMOS Power Amplifier and a DC/DC Converter for GSM 850/900/1800/1900 MHz Systems," IEEE Radio Frequency Circuits Symposium, 2007, pp. 79-82.

Xu, "1-8-GHz GaN-Based Power Amplifier Using Flip-Chip Bonding," IEEE Microwave and Guided Wave Letters, Jul. 1999, pp. 277-279, vol. 9, No. 7.

Kim, Bumman, et al. 'Envelope Tracking Technique for Multimode PA Operation', In: Proceedings of the 39$^{th}$ European Microwave Conference, Sep. 29-Oct. 1, 2009, pp. 429-432.

Kang, Jongchan, et al. 'A Highly Linear and Efficient Differential CMOS Power Amplifier With Harmonic Control', In: IEEE Journal of Solid-State Circuits, Vol. 41, No. 6, June 2006, pp. 1314-1322.

Woo, Young Yun, et al. 'Analysis and Experiments for High-Efficiency Class-F and Inverse Class-F Power Amplifiers', In: IEEE Transactions on Microwave Theory and Techniques, vol. 54, No. 5, May 2006, pp. 1969-1974.

Spirito, M., et al., "Experimental Procedure to Optimize Out-of-Band Terminations for Highly Linear and Power Efficient Bipolar Class-AB RF Amplifiers", IEEE BCTM 7.3, 2005, pp. 112-115.

Collinson, Glenn, et al., "Effects of Harmonic Terminations on Power and Efficiency of GAAS HBT Power Amplifiers at 900MHZ", IEE Colloquium on Solid-State Power Amplifiers, Dec. 16, 1991, pp. 12/1-12/5,.

Search Report and Written Opinion of Jan. 28, 2013 for International Application No. PCT/US2012/045811 filed Jul. 6, 2012. 10 Pages.

* cited by examiner

SIGNAL PATH TERMINATION

CROSS-REFERENCE TO RELATED APPLICATIONS

This application is a continuation of U.S. patent application Ser. No. 13/543,472 filed on Jul. 6, 2012, titled "SIGNAL PATH TERMINATION," the entire disclosure of which is hereby incorporated by reference herein in its entirety. This application claims the benefit under 35 U.S.C. §119(e) of U.S. Provisional Patent Application No. 61/505,956 filed on Jul. 8, 2011, titled "SIGNAL PATH TERMINATION," the disclosure of which is hereby incorporated by reference herein in its entirety.

BACKGROUND

1. Technical Field

The disclosed technology relates to terminating a harmonic component of a signal.

2. Description of the Related Technology

In relatively high frequency applications, such as radio frequency (RF) applications, unwanted signal reflection and/or noise can occur. Such unwanted signal reflection and/or noise can occur at a fundamental frequency of the signal and/or other frequencies, such as harmonics of the fundamental frequency of the signal. To reduce the impact of signal reflection and/or noise, impedance matching can be implemented. One illustrative application in which it is advantageous to minimize unwanted signal reflection and/or noise is a power amplifier system.

Power added efficiency (PAE) is one metric for rating power amplifiers. In addition, linearity is another metric for rating power amplifiers. PAE and/or linearity can be metrics by which customers, such as original equipment manufacturers (OEMs), determine which power amplifiers to purchase. For instance, power amplifiers with a PAE below a certain level may not be purchased by a customer due to the impact of PAE on the customer's product. A lower PAE can, for example, reduce the battery life of an electronic device, such as a mobile phone. However, enhancing PAE can come at the cost of adversely impacting linearity. Similarly, improving linearity can cause a decrease in PAE. At the same time, customers want power amplifiers with high linearity and high PAE.

A load line at an output of a power amplifier can impact both PAE and linearity. Some conventional power amplifier systems have included a load line to match an impedance of the power amplifier output at a fundamental frequency of the power amplifier output signal and also to perform harmonic termination. However, it has proved difficult to match an impedance of the fundamental frequency of the power amplifier output while including harmonic termination in a way that optimizes both PAE and linearity. Accordingly, a need exists to improve both linearity and PAE of a power amplifier.

SUMMARY OF CERTAIN INVENTIVE ASPECTS

The innovations described in the claims each have several aspects, no single one of which is solely responsible for its desirable attributes. Without limiting the scope of this invention, some prominent features will now be briefly discussed.

One aspect of the disclosure is a power amplifier module including a power amplifier die, a load line, and a harmonic termination circuit. The power amplifier die includes one or more power amplifiers configured to amplify an input signal at a power amplifier input and to generate an amplified output signal at a power amplifier output. The power amplifier die also has a plurality of output pins. The load line is configured to match an impedance at the power amplifier output at a fundamental frequency of the amplified output signal. The load line is electrically coupled to a first group of one or more of the plurality of output pins of the power amplifier die external to the power amplifier die. The harmonic termination circuit is separate from the load line. The harmonic termination circuit is configured to terminate at a phase corresponding to a harmonic frequency of the amplified output signal. The harmonic termination circuit is electrically coupled to a second group of one or more other pins of the plurality of output pins of the power amplifier die external to the power amplifier die.

In certain implementations, the harmonic termination circuit can include one or more interconnects coupled to the second group of one or more other pins of the power amplifier die external to the power amplifier die. According to some of these implementations, the one or more interconnects can include a wirebond. Alternatively or additionally, the load line can include one or more other interconnects coupled to the first group of one or more pins of the power amplifier die external to the power amplifier die. In accordance with various implementations, a different number of interconnects can be coupled to the first group of one or more pins of the power amplifier die than to the second group of one or more other pins of the power amplifier die.

According to a number of implementations, the first group of one or more pins of the power amplifier die can be electrically coupled to a first conductive trace on a substrate and the second group of one or more pins of the power amplifier die is electrically coupled to a second conductive trace on the substrate, in which the first conductive trace is included in a different signal path than the second conductive trace external to the power amplifier die. In some of these implementations, the harmonic termination circuit can include a wirebond having a first end and a second end, the first end coupled to the second first group of one or more pins of the power amplifier die; the second conductive trace on the substrate, the second conductive trace coupled to the second end of the wirebond; and a capacitor having a first end and a second end, the first end coupled to the second conductive trace and the second end coupled to a reference voltage.

The harmonic frequency of the amplified output signal can be, for example, a second harmonic frequency of the amplified output signal or a third harmonic frequency of the amplified output signal.

According to various implementations, the power amplifier module can also include an other harmonic termination circuit separate from both the load line and the harmonic termination circuit, the other harmonic termination circuit configured terminate at a phase corresponding to an other harmonic frequency of the amplified output signal. The harmonic termination circuit can be in parallel with the other harmonic termination circuit, according to certain implementations.

The power amplifier module can also include an input matching network configured to match an impedance at the power amplifier input and a separate harmonic termination circuit configured to terminate at a phase of a harmonic frequency of the input signal, according to certain implementations.

In some implementations, a portion of the harmonic termination circuit can be implemented within the power amplifier die.

Another aspect of this disclosure is a mobile device that includes a battery configured to power the mobile device, a power amplifier die, a load line, a harmonic termination circuit, and an antenna electrically coupled to the load line, the antenna configured to transmit an amplified RF signal. The power amplifier die includes a power amplifier configured to amplify a radio frequency (RF) input signal received at a power amplifier input node and to generate the amplified RF signal at a power amplifier output node. The load line is configured to match an impedance at the power amplifier output node at a fundamental frequency of the amplified RF signal. The harmonic termination circuit is separate from the load line. The harmonic termination circuit is configured to terminate at a phase corresponding to a harmonic frequency of the amplified RF signal. The harmonic termination circuit and the load line have different electrical connections to the power amplifier output node external to the power amplifier die.

Another aspect of this disclosure is an apparatus that includes a die and a substrate configured to receive the die. The die includes at least one active circuit element configured to drive an output signal to an output node. The substrate includes a first conductive trace and a second conductive trace. The first conductive trace and the second conductive trace are part of different signal paths on the substrate. The first conductive trace is included in a load line configured to match an impedance at output node of the die at a fundamental frequency of the output signal. The second conductive trace is included in a harmonic termination circuit separate from the load line. The harmonic termination circuit is configured to terminate at a phase corresponding to a harmonic frequency of the output signal.

In certain implementations, the substrate can include a third conductive trace, which is included in an other harmonic termination circuit configured to terminate at a phase corresponding to a different harmonic frequency of the output signal.

According to some implementations, the apparatus can also include a wirebond configured to electrically couple the output node of the die to the second conductive trace, and the wirebond can be included in the harmonic termination circuit.

In accordance with a number of implementations, the apparatus can also include a capacitor mounted to the substrate, in which the capacitor is electrically coupled to the second conductive trace and the capacitor is included in the harmonic termination circuit.

Yet another aspect of this disclosure is a method of manufacturing a module. The method includes coupling power amplifier die to a packaging substrate, the power amplifier die including a power amplifier configured to receive an input signal and generate an amplified output signal; forming a first interconnect between the power amplifier die and a first conductive trace on the packaging substrate, the first interconnect being included in a first termination circuit configured to match an impedance of a fundamental frequency of the amplified output signal; and forming a second interconnect between the power amplifier die and a second conductive trace on the packaging substrate, the second interconnect being separate from the first interconnect, the first conductive trace being separate from the second conductive trace, and the second interconnect being included in a second termination circuit configured to terminate at a phase corresponding to a harmonic of the amplified output signal.

In some implementations, forming the first interconnect can include wirebonding a pad of the power amplifier die to the first conductive trace on the packaging substrate.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

DETAILED DESCRIPTION OF CERTAIN EMBODIMENTS

Figure 1A:
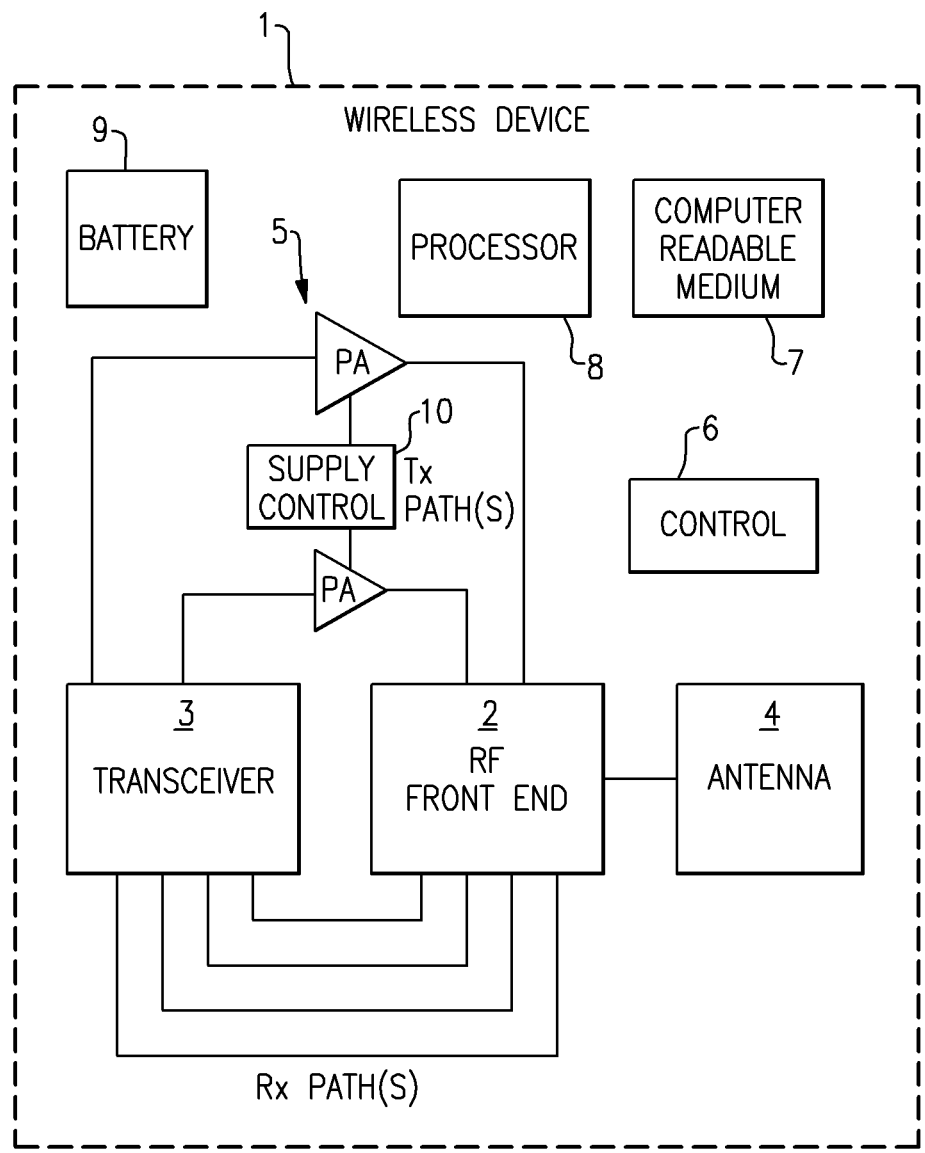
FIG. 1A is a schematic block diagram of an illustrative wireless device.

Generally described, aspects of the present disclosure relate to circuits configured to prevent reflection(s) of a signal, such as termination circuits. More specifically, aspects of the present disclosure relate to separate termination circuits configured to prevent portions of the power of different frequency components of a signal from being reflected. Using the systems, apparatus, and methods described herein, electronic systems, such as systems that include a power amplifier and/or systems configured to transmit radio frequency (RF) signals, can operate more efficiently and/or consume less power. For instance, less energy can be converted to harmonic frequencies of an RF signal and/or energy from harmonic frequency components of an RF signal can be converted into energy at a fundamental frequency of the RF signal. In accordance with one or more features described herein, direct current (DC) energy can be more efficiently converted into RF energy.

As discussed above, customers, such as original equipment manufacturers (OEMs), often desired high PAE and high linearity. A load line at an output of a power amplifier can impact PAE and linearity. The load line at the output power amplifier can be configured to increase and/or optimize linearity and/or PAE. This can include matching fundamental frequency components and/or terminating one or more harmonic frequency components of the power amplifier output. Such a load line can be implemented by termination circuits.

A power amplifier output can include a fundamental frequency component and one or more harmonic frequency components. Similarly, an input to a power amplifier or a power amplifier stage can include a fundamental frequency component and one or more harmonic frequency components. Some conventional power amplifier systems have included a single termination circuit (e.g., a load line) to match an impedance of a fundamental frequency of the signal at the node and terminate at a phase corresponding to a harmonic frequency of the signal at the node. However, it can be difficult to tune the single termination circuit to both match an impedance of the fundamental frequency of an amplified power amplifier output signal and terminate at a phase of a harmonic frequency of the amplified power amplifier output signal in a way that optimizes both PAE and linearity. As a result, PAE can decrease due to optimizing either matching an impedance of the fundamental frequency of amplified power amplifier output or terminating the amplified power amplifier output at a phase of the harmonic frequency.

As described herein, an electronic system can include two or more separate termination circuits each coupled to a node in a signal path, such as a power amplifier output or an input to a power amplifier stage. A first termination circuit can be configured to match an impedance of a fundamental frequency of a signal at a node. In some implementations, the first termination circuit can be included in a fundamental load line. A second termination circuit, separate from the first termination circuit, can be configured to terminate at a phase corresponding to a harmonic frequency of the signal at the node. Circuit elements of the first termination circuit and the second termination circuit can be selected so as to improve PAE and linearity in a power amplifier system.

In some implementations, at least a portion of the first termination circuit and/or the second termination circuit can be embodied external to a die that includes the circuit element(s) driving an output node of the die, such as a power amplifier output of a power amplifier die. For example, the first termination circuit can include one or more interconnects, such as wire bonds, electrically connected to one or more pins of a power amplifier die coupled to a packaging substrate and one or more capacitors separate from the power amplifier die and coupled to the packaging substrate. Alternatively or additionally, the second termination circuit can include one or more interconnects, such as wire bonds, electrically connected to one or more pins of the power amplifier die and one or more other capacitors coupled to a packaging substrate. When a plurality of interconnects are included in a termination circuit, the interconnects can be coupled in parallel with each other. In at least one of the first termination circuit and the second termination circuit, one or more wire bonds can function as an inductive circuit element and be coupled in series with the one or more capacitors coupled to the packaging substrate.

External to the die, the first termination circuit and the second termination circuit can have different electrical connections to the output node of the die. In certain implementations, a first output pin of the die can be coupled to the first termination circuit by a first wirebond and a second output pin of the die can be coupled to the second termination circuit by a second wirebond. In some of these implementations, a first number of wirebonds can couple the first termination circuit to pins of the die and a second number of wirebonds can couple the second termination circuit to pins of the die, in which the first number is different than the second number. According to a number of other implementations, a first output pin of the die can be coupled to the first termination circuit by a first bump and a second output pin of the die can be coupled to the second termination circuit by a second bump. In some of these implementations, a first number of bumps can couple the first termination circuit to pins of the die and a second number of bumps can couple the second termination circuit to pins of the die, in which the first number is different than the second number.

The first termination circuit and the second termination circuit can include different signal paths external to the die. For instance, the first termination circuit termination circuit can include a first trace implemented on the packaging substrate and the second termination circuit can include a second trace on the substrate. The first trace and the second trace can be part of separate signal paths on the substrate. For instance, in some implementations, the first trace can be part of an RF signal path and the second trace can be part of a DC signal path. The first trace and the second trace can be electrically separate from each other outside of the die.

Alternatively or additionally, within the die, the output node can be electrically coupled to branching conductive features such that the output is provided to separate signal paths on the die. The separate signal paths can include a first path included in the first termination circuit and a second path included in the second termination circuit. In this way, the first termination circuit and the second termination circuit can be separately tunable within the die during design of the die. For instance, the first signal path in the die can lead to a first output pin of the die and the second signal path can include a capacitor implemented on the die before leading to a second output pin. In one embodiment, a collector of an output stage of a power amplifier can be directly electrically coupled to both the first termination circuit and the second termination circuit by conductive features of the die.

By using two or more separate termination circuits, each termination circuit can be tuned to prevent reflection of the signal at a desired frequency. For instance, the inductance and/or capacitance of each termination circuit can be selected such that each termination circuit prevents reflect of a desired frequency component of a signal.

The methods, systems, and apparatus for signal path termination described herein may be able to achieve one or more of the following advantageous features, among others. Advantageously, the separate termination circuits configured to prevent reflection of two or more distinct frequency components of a signal can increase one or more of PAE, linearity of a power amplifier, and baseband performance (for example, a broader frequency response and/or greater bandwidth). In some implementations, both PAE and linearity of the power amplifier can be increased. Furthermore, the figure of merit (FOM) of a power amplifier can also be increased. Moreover, battery life can be extended, an amount of heat dissipated can be reduced, signal quality of the signal upon which the separate termination circuits are preventing reflection can be increased, or any combination thereof.

The headings provided herein are for convenience only and do not necessarily affect the scope or meaning of the claims.
Wireless Devices Any of the systems, methods, apparatus, and systems for preventing reflection of two or more frequency components of a signal described herein can be implemented in a variety of electronic devices, such as a wireless device or a mobile device. FIG. 1A schematically depicts a wireless device 1. Examples of the wireless device 1 include, but are not limited to, a cellular phone (e.g., a smart phone), a laptop, a tablet computer, a personal digital assistant (PDA), an electronic book reader, and a portable digital media player. For instance, the wireless device 1 can be a multi-band and/or multi-mode device such as a multi-band/multi-mode mobile phone configured to communicate using, for example, Global System for Mobile (GSM), code division multiple access (CDMA), 3G, 4G, long term evolution (LTE), the like, or any combination thereof.

In certain embodiments, the wireless device 1 can include an RF front end 2, a transceiver component 3, an antenna 4, power amplifiers 5, a control component 6, a computer readable medium 7, a processor 8, a battery 9, and a supply control block 10, or any combination thereof.

The transceiver component 3 can generate RF signals for transmission via the antenna 4. Furthermore, the transceiver component 3 can receive incoming RF signals from the antenna 4.

It will be understood that various functionalities associated with the transmission and receiving of RF signals can be achieved by one or more components that are collectively represented in FIG. 1 as the transceiver 3. For example, a single component can be configured to provide both transmitting and receiving functionalities. In another example, transmitting and receiving functionalities can be provided by separate components.

Similarly, it will be understood that various antenna functionalities associated with the transmission and receiving of RF signals can be achieved by one or more components that are collectively represented in FIG. 1 as the antenna 4. For example, a single antenna can be configured to provide both transmitting and receiving functionalities. In another example, transmitting and receiving functionalities can be provided by separate antennas. In yet another example, different bands associated with the wireless device 1 can be provided with different antennas.

In FIG. 1, one or more output signals from the transceiver 3 are depicted as being provided to the antenna 4 via one or more transmission paths. In the example shown, different transmission paths can represent output paths associated with different bands and/or different power outputs. For instance, the two example power amplifiers 5 shown can represent amplifications associated with different power output configurations (e.g., low power output and high power output), and/or amplifications associated with different bands. In some implementations, one or more termination circuits can be included in one or more of the transmission paths.

In FIG. 1, one or more detected signals from the antenna 4 are depicted as being provided to the transceiver 3 via one or more receiving paths. In the example shown, different receiving paths can represent paths associated with different bands. For example, the four example paths shown can represent quad-band capability that some wireless devices are provided with.

To facilitate switching between receive and transmit paths, the RF front end 2 can be configured to electrically connect the antenna 4 to a selected transmit or receive path. Thus, the RF front end 2 can provide a number of switching functionalities associated with an operation of the wireless device 1. In certain embodiments, the RF front end 2 can include a number of switches configured to provide functionalities associated with, for example, switching between different bands, switching between different power modes, switching between transmission and receiving modes, or some combination thereof. The RF front end 2 can also be configured to provide additional functionality, including filtering of signals. For example, the RF front end 2 can include one or more duplexers. Moreover, in some implementations, the RF front end 2 can include one or more termination circuits configured to prevent reflection of a frequency component of a signal.

The wireless device 1 can include one or more power amplifiers 5. RF power amplifiers can be used to boost the power of a RF signal having a relatively low power. Thereafter, the boosted RF signal can be used for a variety of purposes, included driving the antenna of a transmitter. Power amplifiers 5 can be included in electronic devices, such as mobile phones, to amplify a RF signal for transmission. For example, in mobile phones having a an architecture for communicating under the 3G and/or 4G communications standards, a power amplifier can be used to amplify a RF signal. It can be desirable to manage the amplification of the RF signal, as a desired transmit power level can depend on how far the user is away from a base station and/or the mobile environment. Power amplifiers can also be employed to aid in regulating the power level of the RF signal over time, so as to prevent signal interference from transmission during an assigned receive time slot. A power amplifier module can include one or more power amplifiers.

FIG. 1 shows that in certain embodiments, a control component 6 can be provided, and such a component can be configured to provide various control functionalities associated with operations of the RF front end 2, the power amplifiers 5, the supply control 10, and/or other operating component(s).

In certain embodiments, a processor 8 can be configured to facilitate implementation of various processes described herein. For the purpose of description, embodiments of the present disclosure may also be described with reference to flowchart illustrations and/or block diagrams of methods, apparatus (systems) and computer program products. It will be understood that each block of the flowchart illustrations and/or block diagrams, and combinations of blocks in the flowchart illustrations and/or block diagrams, may be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the acts specified in the flowchart and/or block diagram block or blocks.

In certain embodiments, these computer program instructions may also be stored in a computer-readable memory 7 that can direct a computer or other programmable data processing apparatus to operate in a particular manner, such that the instructions stored in the computer-readable memory produce an article of manufacture including instructions which implement the acts specified in the flowchart and/or block diagram block or blocks. The computer program instructions may also be loaded onto a computer or other programmable data processing apparatus to cause a series of operations to be performed on the computer or other programmable apparatus to produce a computer implemented process such that the instructions that execute on the computer or other programmable apparatus provide operations for implementing the acts specified in a flowchart and/or block diagram block or blocks.

The illustrated wireless device 1 also includes the supply control block 10, which can be used to provide a power supply to one or more of the power amplifiers 5. For example, the supply control block 10 can be a DC-to-DC converter. However, in certain embodiments the supply control block 10 can include other blocks, such as, for example, an envelope tracker configured to vary the supply voltage provided to the power amplifiers 5 based upon an envelope of the RF signal to be amplified.

The supply control block 10 can be electrically connected to the battery 9, and the supply control block 10 can be configured to vary the voltage provided to the power amplifiers 5 based on an output voltage of a DC-DC converter. The battery 9 can be any suitable battery for use in the wireless device 1, including, for example, a lithium-ion battery. By reducing reflection of an output signal of the power amplifiers 5, the power consumption of the battery 9 can be reduced, thereby improving performance of the wireless device 1. For instance, the termination circuits described herein can extend an amount of time that it takes the battery 9 to discharge.

Figure 1B:
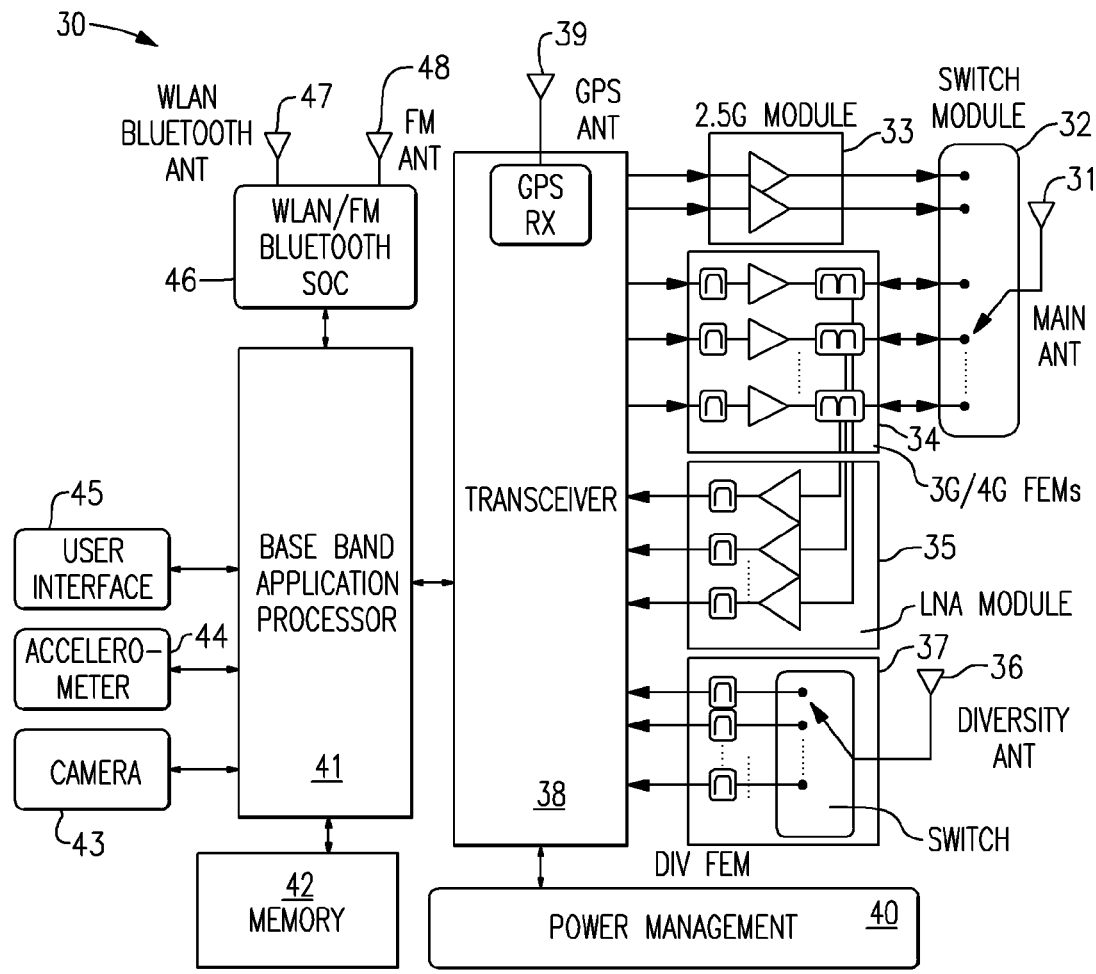
FIG. 1B is a schematic block diagram of another illustrative wireless device.

FIG. 1B is a schematic block diagram of an another illustrative wireless device 30, which can implement one or more aspects of this disclosure. In some implementations, the illustrative wireless device 30 of FIG. 1B can be a mobile phone. Any combination of features of the termination circuits described herein can be implemented in connection with power amplifiers, for example, in the 2.5G module and/or the 3G/4G front end modules (FEMs) of the wireless device 30.

The illustrated wireless device 30 includes a main antenna 31, a switch module 32, a 2.5 G module 33, a 3G/4G front end module 34, an LNA module 35, a diversity antenna 36, a diversity front end module 37, a transceiver 38, a global positioning system (GPS)_antenna 39, a power management controller 40, a base band application processor 41, a memory 42, a user interface 43, an accelerometer 44, a camera 45, a WLAN/FM Bluetooth System on a Chip (SOC) 46, a WLAN Bluetooth antenna 47, and an FM antenna 48. It will be understood that the wireless device 30 can include more or fewer components than illustrated in FIG. 1B.

The transceiver 38 can be a multi-mode transceiver. The transceiver 38 can be used to generate and process RF signals using a variety of communication standards, including, for example, Global System for Mobile Communications (GSM), Code Division Multiple Access (CDMA), wideband CDMA (W-CDMA), Enhanced Data Rates for GSM Evolution (EDGE), other proprietary and non-proprietary communications standards, or any combination thereof. As illustrated, the transceiver 38 is electrically coupled to the 2.5G Module 33 and the 3G/4G front end module 34. A power amplifier in the 2.5G Module 33 and the 3G/4G front end module 34 can boost the power of an RF signal having a relatively low power. Thereafter, the boosted RF signal can be used to drive the main antenna 31. Such power amplifiers can include any of the termination circuits described herein to reduce reflection and/or noise at an input and/or an output. The switch module 32 can selectively electrically coupled power amplifiers in the 2.5G Module 33 and the 3G/4G front end module 34 to the main antenna 31. The switch module 32 can electrically connect the main antenna 31 to a desired transmit path.

In certain implementations, the diversity front-end module 37 and the diversity antenna 36 can help improve the quality and/or reliability of a wireless link by reducing line-of-sight losses and/or mitigating the impacts of phase shifts, time delays and/or distortions associated with signal interference of the main antenna 31. In some embodiments, a plurality of diversity front-end modules and diversity antennas can be provided to further improve diversity.

The wireless device 30 can include the WLAN/FM Bluetooth SOC module 46, which can generate and process received WLAN Bluetooth and/or FM signals. For example, the WLAN/FM Bluetooth SOC module 46 can be used to connect to a Bluetooth device, such as a wireless headset, and/or to communicate over the Internet using a wireless access point or hotspot via the WLAN Bluetooth antenna 47 and/or the FM antenna 48.

The wireless device 30 can also include a baseband application processor 41 to process base band signals. A camera 43, an accelerometer 44, a user interface 45, the like, or any combination thereof can communicate with the baseband application processor 41. Data processed by the baseband application processor can be stored in the memory 42.

Although termination circuits have been illustrated and described in the context of two examples of wireless devices, the termination circuits described herein can be used in other wireless devices and electronics.

Modules

Figure 1C:
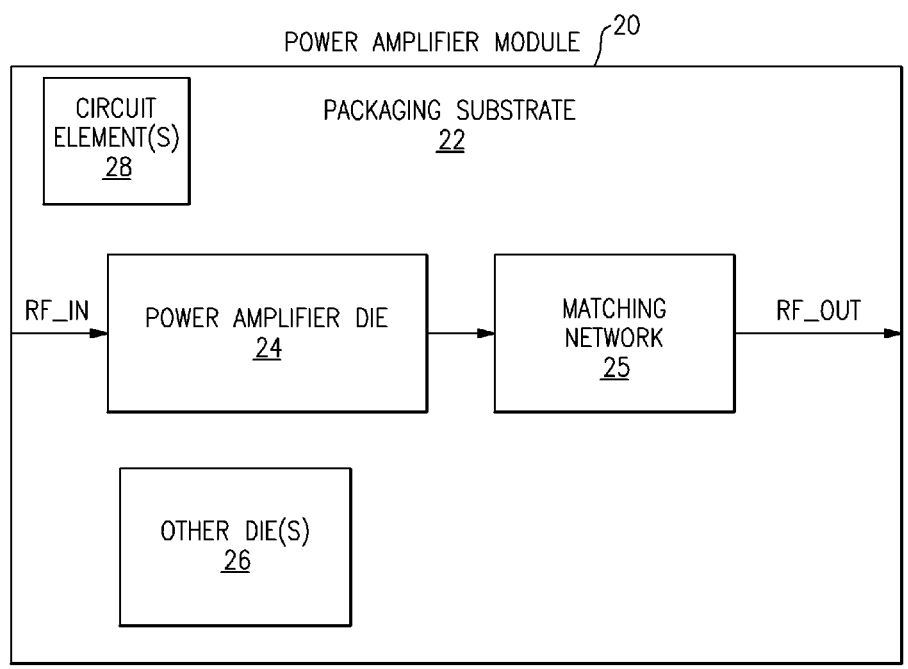
FIG. 1C is a schematic block diagram of an illustrative power amplifier module.

FIG. 1C is a schematic block diagram of a power amplifier module 20. Although a power amplifier module having a power amplifier die will be discussed for illustrative purposes, it will be understood that the principles and advantages described herein can be applied to any suitable die and/or any suitable electronic module. The power amplifier module 20 can include some or all of a power amplifier system. The power amplifier module 20 can be referred to as multi-chip module in certain implementations. The power amplifier module 20 can include a packaging substrate 22, one or more power amplifier die 24, a matching network 25, one or more other die 26, and one or more circuit elements 28 coupled to the packaging substrate 22, the like, or any combination thereof.

The one or more other dies 26 can include, for example, a controller die, which can include a power amplifier bias circuit and/or a direct current-to-direct current (DC-DC) converter. Example circuit element(s) 28 mounted on the packaging substrate can include, for example, inductor(s), capacitor(s), the like, or any combination thereof. The power amplifier module 20 can include a plurality of dies and/or other components attached to and/or coupled to the packaging substrate 22 of the power amplifier module 20. In some implementations, the substrate 22 can be a multi-layer substrate configured to support the dies and/or other components and to provide electrical connectivity to external circuitry when the power amplifier module 20 is mounted on a circuit board, such as a phone board. Thus, the substrate 22 can be configured to receive a plurality of components, such as die and/or separate passive components. The substrate 22 can be a laminate substrate with a finish plating.

The power amplifier die 24 can receive a RF signal at one or more input pins of the power amplifier module 20. The power amplifier die 24 can include one or more power amplifiers, including, for example, multi-stage power amplifiers configured to amplify the RF signal. The amplified RF signal can be provided to one or more output pins of the power amplifier die 24. The one or more output pins can be, for example, bond pad configured for wirebonding. The matching network 25 can be provided on the power amplifier module 20 to aid in reducing signal reflections and/or other signal distortions. The matching network 25 can include one or more termination circuits that implement any combination of features described herein. While the matching network is shown as external to the power amplifier die 24, it will be understood that at least a portion of the matching network 25 can be implemented on the power amplifier die 24. The power amplifier die 24 can be any suitable die. In some implementations, the power amplifier die is a gallium arsenide (GaAs) die. In some of these implementations, the GaAs die has transistors formed using a heterojunction bipolar transistor (HBT) process.

The one or more circuit elements 28 of the power amplifier module 20 can include a capacitor and an inductor. An inductor 28 can be implemented on the substrate 22 as a trace on the substrate 22 or as a surface mount component (SMC) mounted to the substrate 22. The inductor can operate as a choke inductor, and can be disposed between a supply voltage received on a supply voltage pin $V_{CC}$ and the power amplifier die 24. The inductor can provide a power amplifier on the power amplifier die 24 with a supply voltage received on the supply voltage pin $V_{CC}$ while choking and/or blocking high frequency RF signal components. The inductor can include a first end electrically connected to the supply voltage pin $V_{CC}$, and a second end electrically connected to a collector of a bipolar transistor associated with the power amplifier die 24. The capacitor can function as a decoupling capacitor. The capacitor can include a first end electrically connected to the first end of the inductor and a second end electrically coupled to ground, which in certain implementations is provided using a ground pin of the power amplifier module 20 (not illustrated). The capacitor can provide a low impedance path to high frequency signals, thereby reducing the noise of the power amplifier supply voltage, improving power amplifier stability, and/or improving the performance of the inductor as a RF choke. In some implementations, the capacitor can include a SMC.

The matching network 25 can include two or more termination circuits. In some implementations, the matching network 25 can include wire bonds to electrically connect input and/or output pins of the power amplifier die 24 to the packaging substrate 22. The wire bonds can function as inductive circuit elements. The inductance can be increased by adding additional wire bonds in parallel. The wirebonds in parallel can each be coupled to a different pin of the power amplifier die 24. The inductance can be decreased by removing parallel wire bonds and/or adding wire bonds in series. The matching network 25 can also include one or more conductive traces on the substrate 22 and one or more capacitors mounted on the substrate 22. Each termination circuit can include conductive trace(s) and/or capacitor(s) in series with one or more wire bonds electrically connected to one or more pins of the power amplifier die 24. The capacitance and/or inductance values can be selected so as to prevent certain frequency components from being reflected (for example, from an antenna) due to impedance mismatches. This can advantageously increase PAE, power amplifier linearity, bandwidth over which the power amplifier operates within a specification, FOM, the like, or any combination thereof. Termination circuits that can be included in the matching network 25 will be described in more detail herein.

The power amplifier module 20 can be modified to include more or fewer components, including, for example, additional power amplifier dies, capacitors and/or inductors. For instance, the power amplifier module 20 can include one or more additional matching networks 25. In particular there can be another matching network between RF_IN and an input to the power amplifier die 24 and/or an additional matching network between power amplifier stages. As another example, the power amplifier module 20 can include an additional power amplifier die, as well as an additional capacitor and inductor configured to operate as an LC circuit disposed between the additional power amplifier die and the $V_{CC}$ pin of the module. The power amplifier module 20 can be configured to have additional pins, such as in implementations in which a separate power supply is provided to an input stage disposed on the power amplifier die and/or implementations in which the multi-chip module operates over a plurality of bands.

Termination Circuits

As used herein, a termination circuit can refer to a circuit configured to prevent a portion of the power of a signal, such as an RF signal, from being reflected. A termination circuit can be configured to reduce and/or minimize reflections of the signal by matching impedance. This can increase PAE and/or power amplifier gain. Termination circuits can include, for example, a load line configured to match an impedance of a fundamental frequency at a node and one or more harmonic termination circuits.

Figure 2:
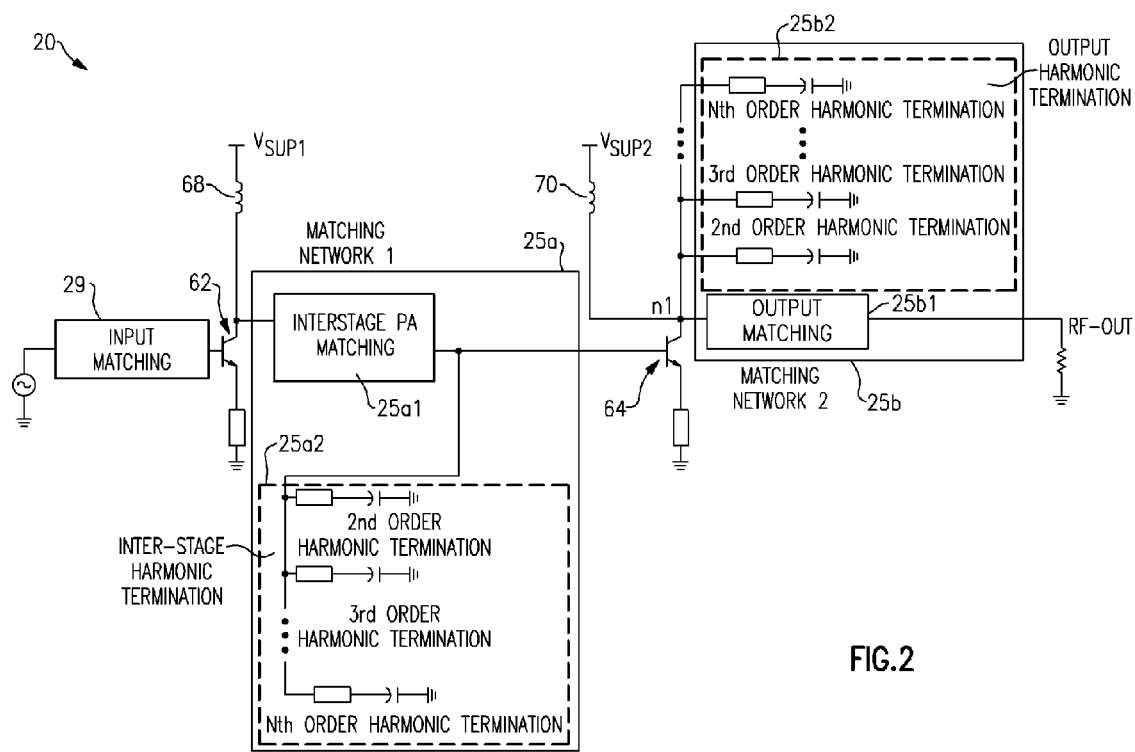
FIG. 2 is a circuit diagram illustrating a power amplifier system with example termination circuits according to an embodiment.

With reference to FIG. 2, a circuit diagram of a power amplifier system with example termination circuits will be described. Some or all of the power amplifier system can be implemented on a power amplifier module 20. The power amplifier module 20 can include power amplifier stages 62 and/or 64 such as GaAs bipolar transistors, power supply pins such as a $V_{SUP1}$ and $V_{SUP2}$, inductors 68 and/or 70, matching and $V_{SUP2}$, networks 25*a*, 25*b*, and input matching circuit 29, or any combination thereof. An RF input signal RF_IN can be provided to a first stage power amplifier 62 via an input matching circuit 29. A first stage amplified RF signal can be generated by the first stage power amplifier 62. The first stage amplified RF signal can be provided to the second stage power amplifier 64 via an inter stage power amplifier matching network 25*a*1. A second stage amplified RF signal can be generated by the second stage power amplifier 64. The second stage amplified RF signal can be provided to an output load via an output matching network 25*b*1. The RF signal RF_OUT provided to the output load can be provided to an output of a power amplifier module in some implementations.

The first stage power amplifier 62 can be coupled to a power supply, for example, the battery 66, via the choke inductor 68. Similarly, the second stage amplifier 64 can be coupled to the power supply, for example, the battery 66, via the choke inductor 70. The first power amplifier stage 62 can consume less power from the power supply when corresponding termination circuits are tuned to prevent reflections of a fundamental frequency component of the first stage amplified RF signal and one or more harmonic components of the first stage amplified RF signal. Similarly, the second power amplifier stage 64 can consume less power from the power supply when corresponding termination circuits are tuned to prevent reflections of a fundamental frequency component of the second stage amplified RF signal and one or more harmonic components of the second stage amplified RF signal.

As illustrated in FIG. 2, the power amplifier module 20 can include a first matching network 25*a* and a second matching network 25*b*. The first matching network 25*a* can include the inter stage fundamental termination circuit 25*a*1 and an inter stage harmonic termination circuit 25*a*2. The second matching network 25*b* can include the output fundamental termination circuit 25*b*1 and an output harmonic termination circuit 25*b*2. Any combination of features of second matching network 25*b* can be applied to the first matching network 25*a*, as appropriate.

For illustrative purposes, the second matching network 25*b* will be described in more detail. The output fundamental termination circuit 25*b*1 can be a fundamental load line. The output fundamental termination circuit 25*b*1 can be configured to prevent a portion of the power of a fundamental frequency component of the second stage amplified RF signal from being reflected from the load. The load can include, for example, an RF switch in a switch module 32 and an antenna 31. The output harmonic termination circuit 25*b*2 can be configured to prevent a portion of the power of one or more harmonic frequency components of the second stage amplified RF signal from being leaked toward a load. More specifically, the output harmonic termination circuit 25*b*2 can include a termination circuit configured to prevent a portion of the power a second order harmonic frequency component of the second stage amplified RF signal from being leaked toward the load. In some implementations, the output harmonic termination circuit 25*b*2 can alternatively or additionally include a termination circuit configured to prevent a portion of the power a third order harmonic frequency component of the second stage amplified RF signal from being leaked toward the load. The principles and advantages of separate termination circuits configured to prevent reflection of a portion of the power a harmonic frequency component of the second stage amplified RF can be applied to any desired harmonic frequency component and/or any suitable number of harmonic frequency components. Although some embodiments are described with reference to harmonic frequencies, one or more features described herein can be applied to any desired frequency.

A termination circuit corresponding to a desired frequency component of the second stage amplified RF signal can include one or more inductive circuit elements in series with one or more capacitive circuit elements. The series circuit elements of the termination circuit can couple an input node of a fundamental load line, such as the output fundamental termination circuit 25b1, to a ground reference voltage. The series circuit elements can include, for example, a wirebond, a trace on the substrate, and a surface mounted capacitor. In certain implementations, the series circuit elements can include a wirebond having a first end coupled to an output pin of a die and a second end coupled to a conductive trace on a packaging substrate. According to some of these implementations, the series circuit elements can also include a capacitor mounted on the packaging substrate. Such a capacitor can have a first end coupled to the conductive trace and a second end coupled to a reference voltage, such as a ground potential. An effective inductance of the inductive circuit element(s) and/or an effective capacitance of the capacitive circuit element(s) can be selected so as to tune the termination circuit to prevent reflections of the desired frequency component of the second stage amplified RF signal.

At node n1, the power amplifier output can include a fundamental frequency component and one or more harmonic frequency components. The RF output signal RF_OUT provided to the output load can be the sum of each of these frequency components. A power amplifier output having a waveform that is efficient for transmitting a signal can result in a desirable linearity of the power amplifier. For instance, it can be desirable to have the frequency components of the power amplifier output at node n1 to combine to form a perfect sine wave. Alternatively or additionally, it ca be desirable to prevent the output at the collector of the bipolar transistor of the power amplifier output stage 64 from clipping.

The impedance at node n1 can be represented by Equations 1 and 2:

$$Z = jx - \frac{1}{jwC} \quad \text{(Equation 1)}$$

$$x = wL - \frac{1}{wC} \quad \text{(Equation 2)}$$

In Equation 1, Z can represent the impedance at node n1, jx can represent the impedance of a transmission line between node n1 and a termination capacitor, and $$\frac{1}{jwC}$$

can represent the impedance of the termination capacitor. In Equation 2, wL can represent an inductive component of the impedance of the transmission line and $$\frac{1}{wC}$$

can represent a capacitive component of the transmission line at a fundamental frequency w. Thus, the transmission line can function as a capacitive and/or an inductive circuit element. The transmission line can include, for example, one or more interconnects from one or more pins of the power amplifier die to a conductive trace on a packaging substrate. The transmission line can also include the conductive trace on the packaging substrate.

The phase of the power amplifier output at node n1 can be shifted by adjusting the impedance of the transmission line. As one example, adding an additional wirebond coupling the node n1 to a conductive trace on a packing substrate in parallel with one or more wirebonds can decrease the inductive impedance component of the transmission line. This can shift the phase of the impedance of a particular frequency along a circuit for the particular frequency on a Smith chart. Shifting the phase of the impedance can in turn adjust the capacitive and inductive components of the impedance, for example as represented by Equations 1 and 2. As another example, adjusting a length of a conductive trace on the packaging substrate can adjust the impedance of the transmission line. By adjusting the impedance of the transmission line and/or a capacitance of a termination capacitor in a harmonic termination circuit, the harmonic termination circuit can be configured to terminate at a phase of a harmonic frequency of the power amplifier output at node n1.

In certain implementations, the impedance at node n1 can be approximately 0 (short circuit) at a second harmonic and the impedance at node n1 can appear very large or infinite (open circuit) at a third harmonic. For instance, a short circuit impedance can be realized by making the impedance equal to 0 in Equations 1 and 2. As another example, when the capacitance of the transmission line approaches zero, then the impedance will appear as an open circuit according to Equations 1 and 2. In some other implementations, the impedance at node n1 can be an open circuit at a second harmonic and a short circuit at a third harmonic. Thus, the harmonic termination circuits can be configured to meet the needs of a desired application.

Figure 3A:
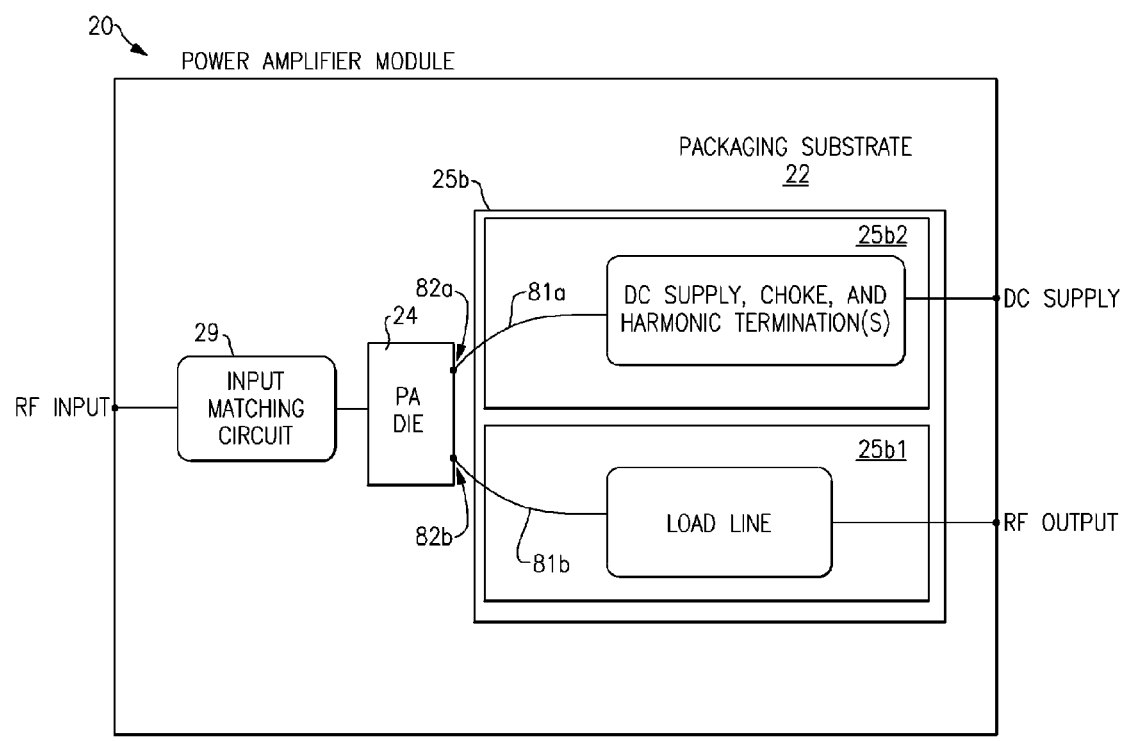
FIG. 3A is a block diagram illustrating an example power amplifier module with termination circuits according to another embodiment.

Referring to FIG. 3A, a block diagram of another power amplifier system including illustrative termination circuits according to another embodiment will be described. Some or all of the power amplifier system illustrated in FIG. 3A can be implemented on a power amplifier module 20. The power amplifier module 20 can include a power amplifier die 24 mounted on a packaging substrate 22. The power amplifier die 24 can include pins, such as output pins 82a and 82b. Although the output pins 82a and 82b, respectively, are illustrated as single pins, these pins can each represent a group of two or more pins in certain embodiments. An output of a power amplifier can be provided to the output pins 82a and 82b. The output pins 82a and 82b can both be coupled to the node n1 of FIG. 2. As illustrated in FIG. 2, the node n1 is coupled to a collector of a GaAs bipolar transistor, an input to the output matching network 25b1, and an input of the output harmonic termination circuit 25b2.

The power amplifier module 20 of FIG. 3A includes an output fundamental termination circuit 25b1 that is separate from an output harmonic termination circuit 25b2. The fundamental termination circuit 25b1 and the harmonic termination circuit 25b2 can have different electrical connections to an output node of a power amplifier, such as node n1 in FIG.

2, external to the power amplifier module 24. For instance, different interconnects can electrically couple the fundamental termination circuit 25b1 and the harmonic termination circuit 25b2 to different pins of the power amplifier module 24. The fundamental termination circuit 25b1 and the harmonic termination circuit 25b2 can be included in separate signal paths on the substrate 22. These separate signal paths may not be electrically connected to each other on the substrate 22 or via circuit elements external to the power amplifier module 24. The fundamental termination circuit 25b1 and the harmonic termination circuit 25b2 can be included in separate signal paths. For instance, the output of a power amplifier can be provided to two or more separate signal paths with one path going to the fundamental termination circuit 25b1 and a different path going to the harmonic termination circuit 25b2. The two or more separate paths can include a DC path that is separate from an RF path, for example, as illustrated.

The fundamental termination circuit 25b1 can include one or more interconnects 81b, such as wire bonds and/or bumps, coupling one or more output pins 82b to a conductive trace the packaging substrate 22. In implementations with more than one output pin 82b, the interconnects 81b electrically connecting the pins 82b to the conductive trace can be in parallel with each other. The number of interconnects 81b (for example, wire bonds) can be adjusted to change the inductance of the output fundamental termination circuit 25b1 so as to prevent reflection of a desired frequency component of a signal on the signal path at the output pins 82b. Including more interconnects 81b in parallel can reduce an effective inductance. The conductive trace can couple the interconnect(s) 81b in series with a capacitor. The conductive trace can also add an inductance and/or a capacitance to the termination circuit, for example, as discussed above. A capacitance of the capacitor can be selected so as to prevent reflection of a desired frequency component of a signal on the signal path at the output pin(s) 82b. Alternatively or additionally, an effective capacitance of the termination circuit can be adjusted by including additional capacitor(s) in series and/or parallel with the capacitor and/or by including other capacitive circuit elements. The effective inductance the effective capacitance of the termination circuit can be configured in combination with each other so as to increase linearity and/or PAE of the power amplifier module 20. The effective inductance and the effective capacitance can be determined, for example, based on the number of interconnects coupled to an output pin of the power amplifier die 24, the dimensions (such as length) of a conductive trace on the substrate, and the capacitance of a capacitor mounted on the substrate.

The output harmonic termination circuit 25b2 includes one or more interconnects 81a, such as wire bonds and/or bumps, coupling one or more output pins 82a to a conductive trace of the packaging substrate 22. In implementations with more than one output pin 82a, the interconnects 81a electrically connecting the pins 82a to the wire trace can be coupled in parallel. The number of interconnects 81a (for example, wire bonds) included in the output harmonic termination circuit 25b2 can be configured separately from the number of interconnects 81b of the output fundamental termination circuit 25b1. In this way, inductance of different termination circuits can be tuned to increase linearity and/or PAE of the power amplifier module 20. This can include matching an impedance of a fundamental frequency of a signal at the node in the output fundamental termination circuit 25b1 and terminating at a phase corresponding to a harmonic frequency of the signal at the node in the output harmonic termination circuit 25b2. Effective capacitances of the different termination circuits can also be configured separately and independent of each other. Because the different termination circuits can be included in different signal paths, changes to either termination circuit may not affect another termination circuit.

A conductive trace can couple interconnects, such as wire bonds, in series with one or more capacitive circuit elements, such as capacitors, in the output matching network illustrated in FIG. 3A. An effective capacitance of the termination circuit can be selected so as to prevent reflection of an other desired frequency component of a signal on the signal path at the output pin(s) 82a that is different from the desired frequency component of the signal that the output fundamental termination circuit 25b1 is configured to prevent from reflecting. In certain implementations, the different termination circuits can include different conductive traces on the substrate 22 that can add inductance and/or capacitance to respective termination circuits. The different conductive traces can be configured separately and independent of each other so that each conductive trace can provide desired termination at a selected frequency. The effective inductance and the effective capacitance of the termination circuit can be configured in combination with each other so as to increase linearity and/or PAE of the power amplifier module 20.

Figure 3B:
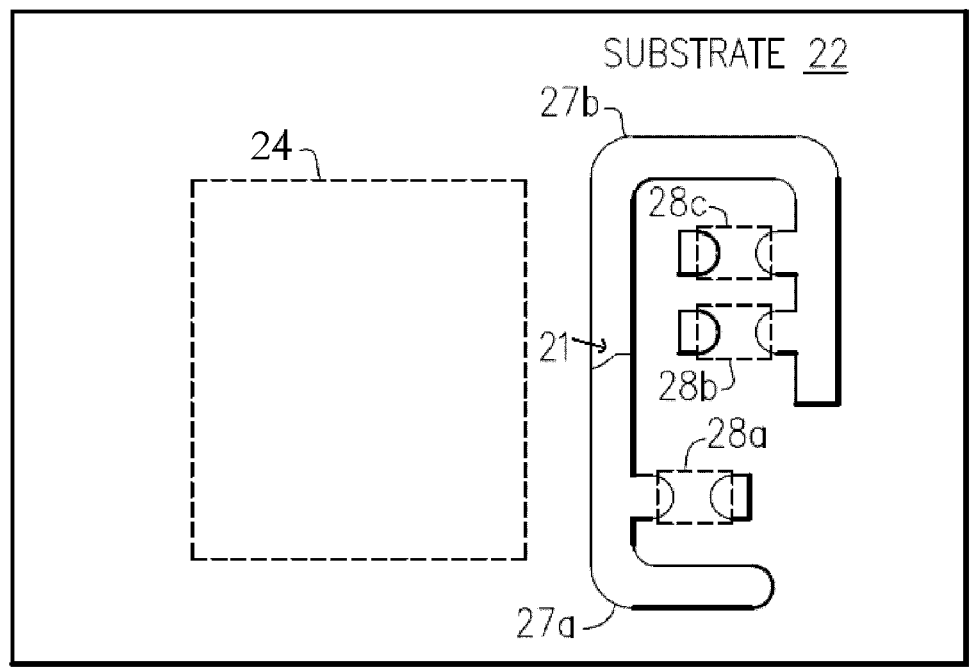
FIG. 3B illustrates an example substrate in accordance with an embodiment.

FIG. 3B illustrates an example substrate 22 in accordance with an embodiment. The substrate 22 can be a packaging substrate, such as a laminate substrate. The substrate 22 can be included in any of the modules discussed herein, such as the power amplifier modules 20. The substrate 22 is configured to receive a plurality of components and includes conductive traces. The dashed lines in FIG. 3B illustrate areas where the substrate 22 is configured to receive components. For instance, as illustrated the substrate 22 is configured to receive a power amplifier module 24 and a plurality of surface mounted capacitors 28a, 28b, and 28c. The illustrated substrate 22 also includes a first conductive trace 27a and a second conductive trace 27b. As illustrated in FIG. 3B, a separation 21 separates the first conductive trace 27a from the second conductive trace 27b. The separation 21 can physically separate the first conductive trace 27a from the second conductive trace 27b at any suitable point for a desired application. Thus, the first conductive trace 27a and the second conductive trace 27b are part of different signal paths on the substrate 22.

The substrate 22 can be configured to implement at least a portion of the termination circuits discussed herein. For instance, the first conductive trace 27a can be included in a load line configured to match an impedance at output node of a power amplifier die 24 at a fundamental frequency of the power amplifier output signal. As illustrated, the substrate 22 is also configured to receive a surface mounted capacitor 28a that is part of the load line. The second conductive trace 27b can be included in a harmonic termination circuit separate from the load line. The harmonic termination circuit can be configured to terminate at a phase corresponding to a harmonic frequency of the power amplifier output. As illustrated, the second conductive trace 27b is configured to receive one or more surface mounted capacitors 28b, 28c that are part of the harmonic termination circuit.

Figure 4A:
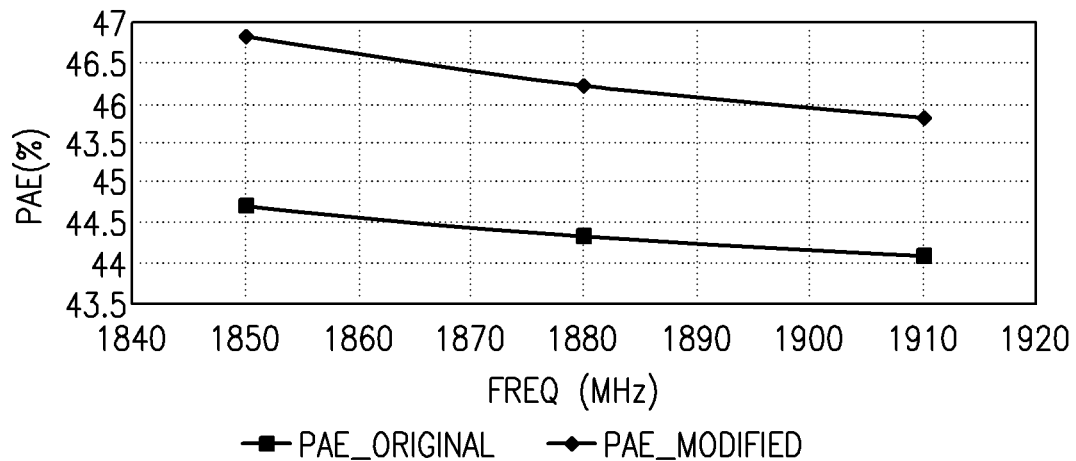
FIGS. 4A-4C show simulation results comparing performance of the embodiment of FIG. 3A to a conventional implementation.
Figure 4B:
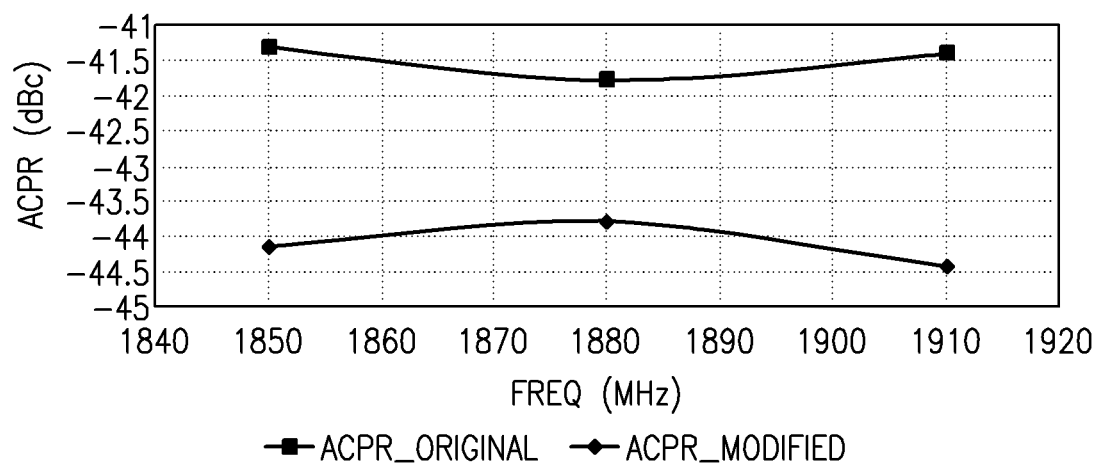
Figure 4C:
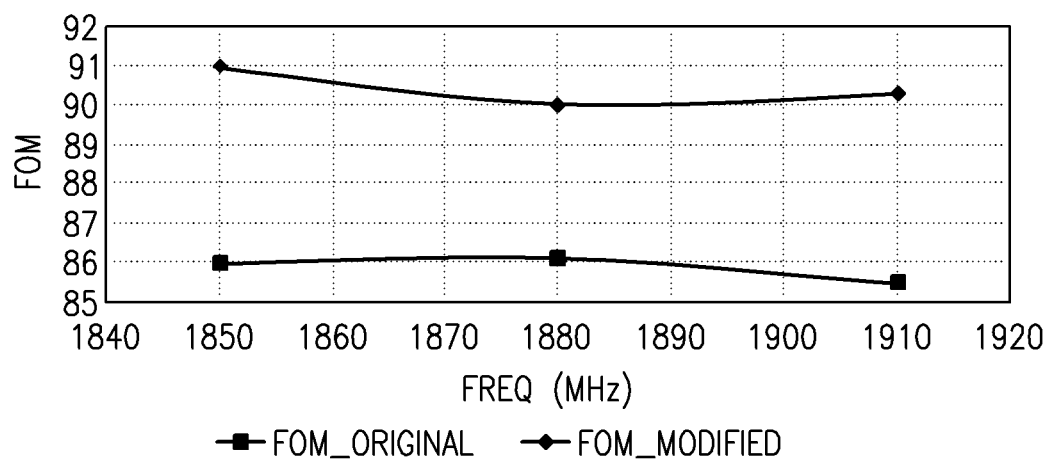

FIGS. 4A-4C show simulation results comparing performance of the power amplifier module 20 of FIG. 3A to a conventional power amplifier with a single termination circuit. As shown in FIG. 4A, the PAE increased by about 2-3% in one embodiment of the power amplifier module 20 of FIG. 3A over the frequency range of 1850 MHz to 1910 MHz compared to a conventional design. Moreover, in some simulations, PAE has increased 5% or more according to the principles and advantages described herein. Increases in PAE of a system can, for example, increase an amount of time for a battery powering the system to discharge.

FIG. 4B shows an improvement in linearity, as measured by an adjacent channel power ratio (ACPR), in one embodiment of the power amplifier module 20 of FIG. 3A compared to a conventional design. As illustrated in FIG. 4B, ACPR improves by about 2 to 3 dB over the frequency range of 1850 MHz to 1910 MHz. Together FIG. 4A and FIG. 4B show that the power amplifier system of FIG. 3A can improve both PAE and ACPR at the same time.

Figure of merit (FOM) is one way to characterize overall quality of a power amplifier. FIG. 4C shows that the FOM increases from about 86 to about 90 in one embodiment of the power amplifier module 20 of FIG. 3A over the frequency range of 1850 MHz to 1910 MHz compared to a conventional design. Moreover, in some implementations, FOM has increased from about 82 to about 90 in accordance with one or more of the principles and advantages described herein.

Furthermore, the increase in PAE, ACPR, FOM, or any combination thereof, has been demonstrated at a number of other frequency bands, for example, 1710 MHz to 1780 MHz. Simulation data indicates that separate termination circuits for a fundamental frequency component of a signal and harmonic frequency component can increase PAE, ACPR, FOM, or any combination thereof over a variety of frequencies in the RF spectrum and other frequency spectra. In addition, improvement in PAE, ACPR, FOM, or any combination thereof has been shown over different power levels.

Figure 5:
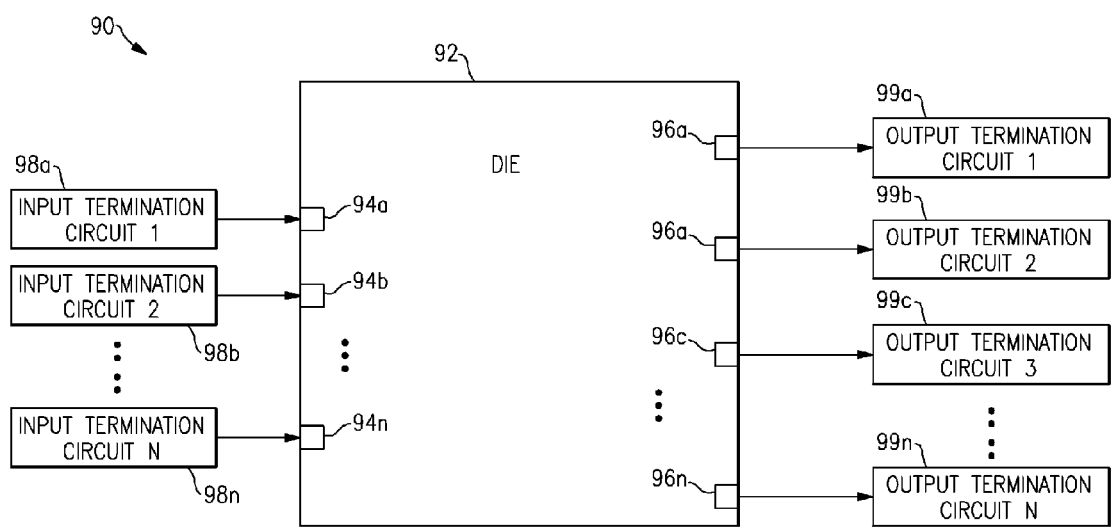
FIG. 5 is a block diagram illustrating a die and example termination circuits according to another embodiment.

Referring to FIG. 5 a block diagram illustrating a die and example termination circuits termination circuits according to another embodiment will be described. FIG. 5 illustrates that any suitable number of separate termination circuits can be implemented based on a desired application. Moreover, FIG. 5 illustrates that a plurality of separate termination circuits can be implemented at a variety of nodes within an electronic system, such as an input pin(s) of a die and/or output pin(s) of a die. Although FIG. 5 illustrates a plurality of separate termination circuits at in input pins of a die and output pins of a die, any combination of features of separate termination circuits described herein can be applied to a signal at other nodes of an electronic system, for example, within a die such as a power amplifier die. Moreover, according to certain implementations, at least a portion of one or more of the separate termination circuits coupled to a node can be embodied within a die. In some of these implementations, one or more of the separate termination circuits coupled to the node can be embodied outside the die.

As shown in FIG. 5, an electronic system 90 can include a die and a plurality of termination circuits. The electronic system 90 can be included, for example, in a wireless device of FIG. 1A or FIG. 1B, a power amplifier module of FIG. 1C, the like, or any combination thereof. In some implementations, a die 92 can be a power amplifier die 24. In other implementations, the die 92 can include, for example, a frequency multiplier, a mixer, or the like.

The die 92 can include a plurality of including input pins 94a-94n and/or output pins 96a-96n. Separate termination circuits that include any combination of features described herein can be coupled to different pins and/or a different groups of two or more pins. For instance, input termination circuits 98a-98n can each be configured to prevent reflection of a different frequency component of a signal at a node coupled to one or more input pins of the die 92. Input termination circuits can be coupled to input pins 94a-94n, respectively, of the die 92. In some implementations, an input termination circuit can be coupled to two or more input pins of the die 92. Alternatively or additionally, two or more input termination circuits can be coupled to a single pin of the die 92. Similarly, output termination circuits 99a-99n can each be configured to prevent reflection of a different frequency component of a signal at a node that includes one or more output pin. Output termination circuits can be coupled to input pins 94a-94n, respectively, of the die 92. In some implementations, an output termination circuit can be coupled to two or more output pins of the die 92. Alternatively or additionally, two or more output termination circuits can be coupled to a single pin of the die 92.

Any suitable number of input pins 94a-94n and/or output pins 96a-96n can be included on the die 92. Moreover, any suitable number of input termination circuits 98a-98n and/or output termination circuits 99a-99n can be included in the electronic system 90. In some implementations, the number of separate input termination circuits 98a-98n and/or separate output termination circuits 99a-99n can be selected based on a desired number of harmonic frequency components to terminate.

Figure 6:
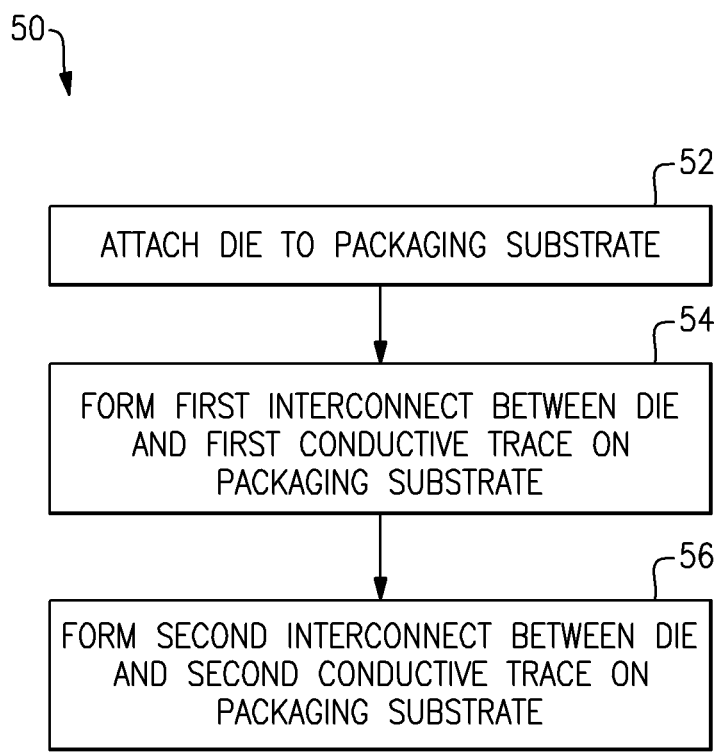
FIG. 6 is a flow diagram of an illustrative method of manufacturing a module according to yet another embodiment.

FIG. 6 is a flow diagram of an illustrative method 50 of manufacturing a module according to yet another embodiment. It will be understood that any of the methods discussed herein may include greater or fewer operations and the operations may be performed in any order, as appropriate. Further, one or more acts of the methods can be performed either serially or in parallel. For instance, the acts at blocks 54 and 56 of the method 50 can be performed either serially or in parallel. The method 50 can be performed as part of manufacturing any of the modules discussed herein, such as the power amplifier module 20.

At block 52, a die can be attached to a substrate. For instance, a power amplifier die 24 can be attached to a packaging substrate 22.

A first interconnect between the die and a first conductive trace on the substrate can be formed at block 54. The first interconnect can be coupled to one or more output pins of the die. The first interconnect can include, for example, one or more wirebonds and/or one or more bumps. In certain implementations, the first interconnect can include a wirebond that is bonded to a pad of the die. According to some of these implementations, the wirebond can also be bonded to a finish plating of the substrate. The first interconnect can be included in a first termination circuit configured to match an impedance of a fundamental frequency of an output signal of the die.

A second interconnect between the die and a second conductive trace on the substrate can be formed at block 56. The second interconnect can be coupled to one or more output pins of the die. The second interconnect can include, for example, one or more wirebonds and/or one or more bumps. In certain implementations, the second interconnect can include a wirebond that is bonded to a pad of the die. According to some of these implementations, the wirebond can also be bonded to a finish plating of the substrate. The second interconnect can be included in a second termination circuit configured to terminate at a phase corresponding to a harmonic of the amplified output signal.

Applications

Some of the embodiments described above have provided examples in connection with wireless devices that include power amplifiers. However, the principles and advantages of the embodiments can be used for any other systems or apparatus that have needs for two or more separate termination circuits configured to prevent reflection of two or more different frequency components of a signal. For example, separate termination circuits can be implemented in connection with multipliers, such as frequency multipliers, and/or mixers instead of power amplifiers. As another example, separate termination circuits can be implemented at any point on a signal path at which it is desirable to separate termination circuits for two or more different frequency components, such as a fundamental frequency component and a harmonic frequency component.

Systems implementing one or more aspects of the present disclosure can be implemented in various electronic devices. Examples of electronic devices can include, but are not limited to, consumer electronic products, parts of the consumer electronic products, electronic test equipment, etc. More specifically, electronic devices configured implement one or more aspects of the present disclosure can include, but are not limited to, an RF transmitting device, any portable device having a power amplifier, a mobile phone (for example, a smart phone), a telephone, a base station, a femtocell, a radar, a device configured to communication according to the WiFi standard, a television, a computer monitor, a computer, a hand-held computer, a tablet computer, a laptop computer, a personal digital assistant (PDA), a microwave, a refrigerator, an automobile, a stereo system, a DVD player, a CD player, a VCR, an MP3 player, a radio, a camcorder, a camera, a digital camera, a portable memory chip, a washer, a dryer, a washer/dryer, a copier, a facsimile machine, a scanner, a multi functional peripheral device, a wrist watch, a clock, etc. Part of the consumer electronic products can include a multi-chip module, a power amplifier module, an integrated circuit including two or more termination circuits, a packaging substrate including one or more circuit elements, etc. Moreover, other examples of the electronic devices can also include, but are not limited to, memory chips, memory modules, circuits of optical networks or other communication networks, and disk driver circuits. Further, the electronic devices can include unfinished products.

CONCLUSION

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. An apparatus comprising:
 a power amplifier die including a power amplifier configured to receive a radio frequency input signal and to provide an amplified radio frequency signal at a power amplifier output;
 an output matching network electrically connected to the power amplifier output, the output matching network configured to provide impedance matching at a fundamental frequency of the amplified radio frequency signal, and the output matching network including a first capacitor external to the power amplifier die; and
 a harmonic termination circuit electrically connected to the power amplifier output, the harmonic termination circuit configured to terminate at a phase corresponding to a harmonic frequency of the amplified radio frequency signal, the harmonic termination circuit including a second capacitor external to the power amplifier die, the first capacitor and the second capacitor having separate electrical connections to the power amplifier die.

2. The apparatus of claim 1 wherein the power amplifier die includes a first pin and a second pin, the first capacitor being electrically connected to the first pin and the second capacitor being electrically connected to the second pin.

3. The apparatus of claim 1 wherein the first second and the second capacitor are electrically connected to the power amplifier die by way of different interconnects.

4. The apparatus of claim 1 wherein the first second and the second capacitor are electrically connected to the power amplifier die by way of different wirebonds.

5. The apparatus of claim 1 wherein further comprising a substrate including a first trace and a second trace, the first trace and the second trace being external to the power amplifier die, and the output matching network including the first trace and the harmonic termination circuit including the second trace.

6. The apparatus of claim 5 wherein the first capacitor is coupled to the substrate and the second capacitor is coupled to the substrate, the first conductive trace being in an electrical path between the first capacitor and the power amplifier die, and the second conductive trace being in an electrical path between the second capacitor and the power amplifier die.

7. The apparatus of claim 1 wherein the first capacitor and the second capacitor are surface mount capacitors.

8. The apparatus of claim 1 wherein the harmonic frequency of the amplified radio frequency signal is a second harmonic frequency of the amplified radio frequency signal.

9. The apparatus of claim 1 further comprising an input matching network configured to match an impedance at an input of the power amplifier and an input harmonic termination circuit configured to terminate at a phase of a harmonic frequency of the radio frequency input signal.

10. The apparatus of claim 1 further comprising an other harmonic termination circuit electrically connected to the power amplifier output, the other harmonic termination circuit configured to terminate at a phase corresponding to a different harmonic frequency of the amplified radio frequency signal than the harmonic termination circuit.

11. The apparatus of claim 1 wherein a portion of the harmonic termination circuit is implemented within the power amplifier die.

12. An apparatus comprising:
a power amplifier die including a power amplifier configured to receive a radio frequency input signal and to provide an amplified radio frequency signal at a power amplifier output;
an output matching network electrically connected to the power amplifier output, the output matching network configured provide impedance matching at a fundamental frequency of the amplified radio frequency signal, and the output matching network including a first conductive trace on a substrate, the first conductive trace being external to the power amplifier die; and
a harmonic termination circuit electrically connected to the power amplifier output, the harmonic termination circuit configured to terminate at a phase corresponding to a harmonic frequency of the amplified radio frequency signal, the harmonic termination circuit including a second conductive trace on the substrate, the second conductive trace being external to the power amplifier die, and the first conductive trace and the second conductive trace having separate electrical connections to the power amplifier die.

13. The apparatus of claim 12 wherein the power amplifier die includes a first pin and a second pin, the first conductive trace being electrically connected to the first pin and the second conductive trace being electrically connected to the second pin.

14. The apparatus of claim 12 wherein the first conductive trace and the second conductive trace are electrically connected to the power amplifier die by way of different wirebonds.

15. The apparatus of claim 12 wherein the substrate is a laminate substrate and power amplifier die is coupled to the substrate.

16. The apparatus of claim 12 wherein the substrate is a packaging substrate and the apparatus is configured as a power amplifier module.

17. The apparatus of claim 12 further comprising an antenna electrically connected to the output matching network, and the apparatus is configured as a mobile device.

18. The apparatus of claim 12 wherein the harmonic termination circuit includes a capacitor that is external to the power amplifier die, the capacitor having a first end electrically connected to the second conductive trace and a second end electrically connected to ground.

19. The apparatus of claim 12 wherein the harmonic frequency of the amplified radio frequency signal is a second harmonic frequency of the amplified radio frequency signal.

20. An apparatus comprising:
a die including an active circuit element configured to provide an output signal at an output node of the die;
an output matching network electrically connected to the output node, the output matching network configured to provide impedance matching at a fundamental frequency of the output signal, the output matching network including a first conductive trace on a substrate and a first capacitor electrically connected to the first conductive trace, the first conductive trace and the first capacitor being external to the die; and
a harmonic termination circuit electrically connected to the output node, the harmonic termination circuit configured to terminate at a phase corresponding to a harmonic frequency of the output signal, the harmonic termination circuit including a second conductive trace on the substrate and a second capacitor electrically connected to the second conductive trace, the second conductive trace and the second capacitor being external to the die, the first conductive trace and the second conductive trace having separate electrical connections to the die.

* * * * *